(12) United States Patent
Rivnay et al.

(10) Patent No.: US 11,523,533 B1
(45) Date of Patent: Dec. 6, 2022

(54) DATACENTER COMPONENT MAINTENANCE TIME TRACKING

(71) Applicant: Amazon Technologies, Inc., Seattle, WA (US)

(72) Inventors: Roey Rivnay, Seattle, WA (US); William Mark Megarity, Renton, WA (US); Priti Choudhary, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 117 days.

(21) Appl. No.: 17/008,839

(22) Filed: Sep. 1, 2020

(51) Int. Cl.
| | | |
|---|---|---|
| *G08B 5/36* | (2006.01) | |
| *G08B 21/24* | (2006.01) | |
| *G06F 11/30* | (2006.01) | |
| *G11B 33/10* | (2006.01) | |
| *H05K 7/14* | (2006.01) | |
| *G09G 3/14* | (2006.01) | |
| *H05K 7/20* | (2006.01) | |

(52) U.S. Cl.
CPC ....... *H05K 7/1494* (2013.01); *G06F 11/3055* (2013.01); *G06F 11/3058* (2013.01); *G08B 5/36* (2013.01); *G08B 21/24* (2013.01); *G09G 3/14* (2013.01); *G11B 33/10* (2013.01); *H05K 7/1488* (2013.01); *H05K 7/20836* (2013.01)

(58) Field of Classification Search
CPC ............... H05K 7/1494; H05K 7/1488; H05K 7/20836; G06F 11/3055; G06F 11/3508; G08B 5/36; G08B 21/24; G09G 3/14; G11B 33/10
See application file for complete search history.

(56) References Cited

U.S. PATENT DOCUMENTS

| | | | | |
|---|---|---|---|---|
| 6,871,300 B1 * | 3/2005 | Irving | ................ | G06F 11/3051 |
| | | | | 714/4.12 |
| 9,579,245 B2 * | 2/2017 | Larkner | .............. | G07F 17/0071 |
| 2021/0274688 A1 * | 9/2021 | Rajput | ............... | H05K 7/20836 |
| 2021/0329755 A1 * | 10/2021 | Lauffer | ................ | H05B 47/115 |

* cited by examiner

*Primary Examiner* — John A Tweel, Jr.
(74) *Attorney, Agent, or Firm* — Kilpatrick Townsend & Stockton LLP

(57) ABSTRACT

Systems and techniques for tracking and providing real-time visualizations of maintenance time for datacenter components. The systems include sensors to detect when datacenter components are opened for maintenance, such as hot switching of hard drive disks, to initialize a countdown timer. Status indicator lights of components within the datacenter component are used to display visual representations of the countdown timer. The visualizations present a remaining or elapsed maintenance time remaining to ensure components of the datacenter component are not damaged by overheating during maintenance.

20 Claims, 8 Drawing Sheets

DATACENTER COMPONENT MAINTENANCE TIME TRACKING

BACKGROUND

A datacenter typically contains a collection of datacenter components such as computer servers and components for the management, operation and connectivity of those datacenter components. Datacenter components are often arranged together. For example, datacenter components can be vertically arranged in racks or within cabinets. Datacenter components sometimes require maintenance.

BRIEF DESCRIPTION OF THE DRAWINGS

Various embodiments in accordance with the present disclosure will be described with reference to the drawings, in which.

DETAILED DESCRIPTION

Figure 1:
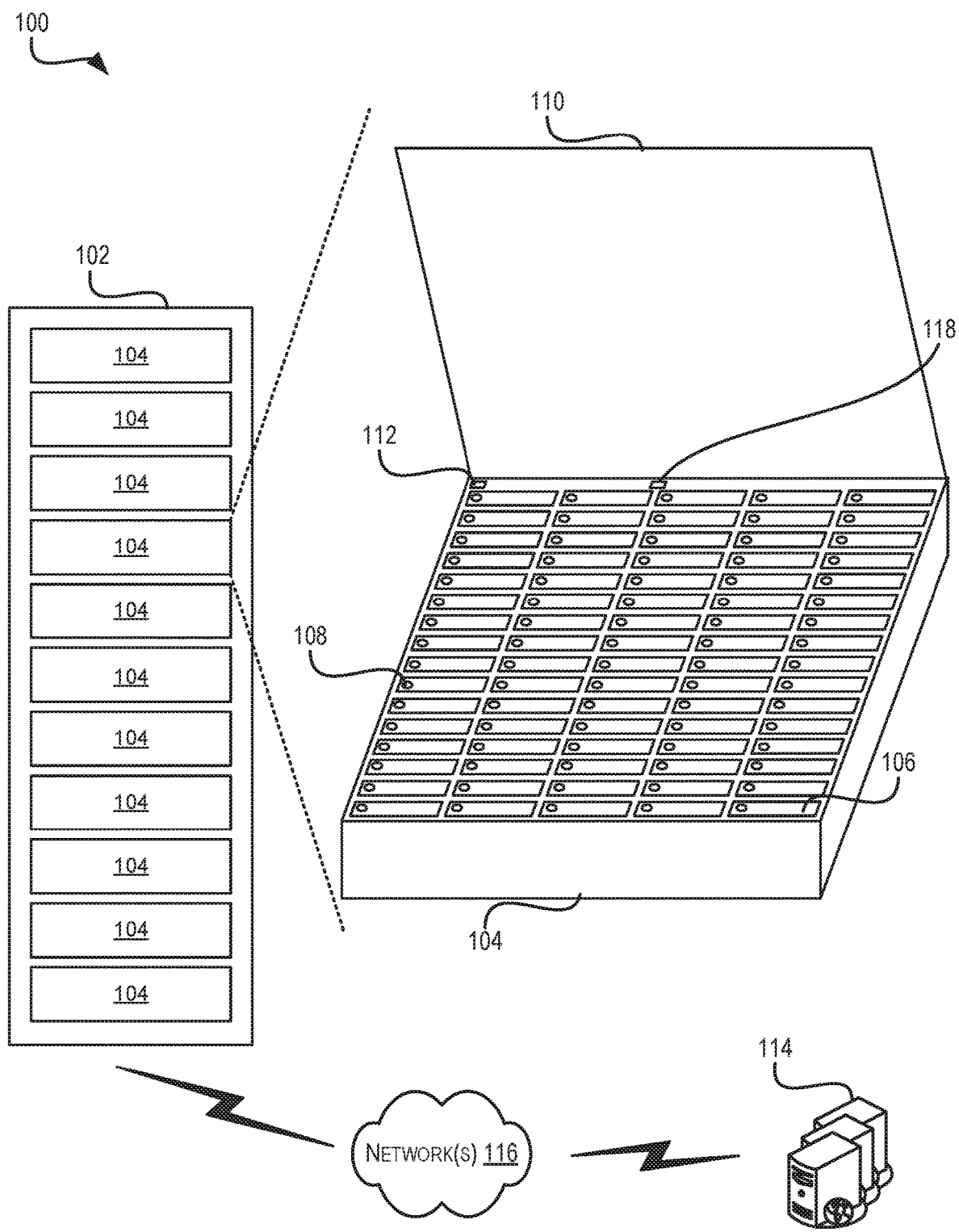
FIG. 1 illustrates an example system with a datacenter component rack and an associated datacenter component shown in an open configuration, according to at least some embodiments.

Embodiments and techniques described herein are directed to tracking and displaying maintenance time for datacenter components. Some datacenter components (e.g., servers) allow hot servicing and maintenance. That is, during operation, and without shutting entirely down, components within a datacenter component can be replaced while the datacenter component is still in operation. To access the components, the datacenter component typically must be removed, at least partially, from a datacenter component rack, and a lid opened to enable replacement of components, such as hard drive disks. Removal of the lid, and possibly other components such as fan and other cooling systems, inhibits or prevents active cooling of the datacenter component. Therefore, it is possible for the datacenter components to overheat due to continued operation with compromised active cooling.

Aspects of the present disclosure define a timeframe for maintenance that is intended to limit the time during which the datacenter component is open and separated from the active cooling components and other components. Limiting to the timeframe helps ensure that components are not damaged by overheating during maintenance. For example, upon opening the lid of the datacenter component, a switch or sensor may be automatically actuated that provides a signal to a computer to begin a countdown timer for the maintenance window. Upon completion of the maintenance window, the datacenter component should be returned to its normal operation state, with the lid closed and active cooling is no longer compromised. To signal to a service provider an elapsed maintenance time or a remaining maintenance time, existing lights built in to the datacenter component are controlled to provide visual cues that the deadline is approaching or has been met. By utilizing existing lights in the datacenter components, the visual indicator is provided without the need to include additional hardware or significant devices into the datacenter component. For example, the lights may be lights on hard disk drives or any suitable storage device such as solid-state drives contained within an enclosure of a server as part of a server rack. The visual cues may include shutting off the lights as the maintenance time period reduces, for example by shutting off lights after a particular percentage or set number of seconds out of a predetermined maintenance time window have elapsed. Different patterns and visual cues can be implemented to ensure the service provider has a clear view and can easily monitor remaining maintenance time while performing service and not require diverting attention away from the datacenter component.

Techniques described herein include using status indication lights of hard disk drives (HDDs) to provide visual cues corresponding to an elapsed or remaining maintenance time window remaining. By providing simple visual cues to a service provider, the maintenance window can be easily monitored to prevent damage to datacenter components during hot switching or other maintenance of components within the datacenter components. Additionally, the use of existing status lights on HDDs provides a simple and low-cost method to implement maintenance time tracking without the need for expensive retrofitting or custom-designed datacenter components. Furthermore, actual maintenance times can be tracked and logged to ensure compliance with maintenance windows to ensure proper procedures are followed to prevent damage and overheating to datacenter components or components thereof.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

FIG. 1 illustrates a system 100 with a datacenter component rack 102 and an associated datacenter component 104 shown in an open configuration, according to at least some embodiments. The system 100 illustrates components in a datacenter component rack 102 that enable techniques and methods described herein for tracking and providing visualizations of maintenance windows. In particular, the system 100 is able to perform the methods described herein without significant additions or alterations to existing datacenter components 104 and systems 100. The system 100 also includes a computing resource 114 in communication with the datacenter component 104 over network(s) 116.

The system 100 includes a datacenter component rack 102 designed to accommodate a plurality of datacenter components 104. The datacenter component rack 102 may be designed to accept datacenter components 104 at varying locations, heights, and/or of varying sizes. In the example shown in FIG. 1, the datacenter components 104 are shown having the same size, though in some examples other and different sizes of datacenter components are envisioned. For instance, a datacenter component 104 located within the datacenter component rack 102 is of a first size, which may be sized according to a rack unit (RU) size system to be any size, such as ½ RU and/or 1 RU. Additional datacenter components 104 may be of the same size or RU as the datacenter component 104 or may be of a different size. Other datacenter components (not shown) may be installed in the datacenter component rack 102. The datacenter components 104, may be distributed at any height along the datacenter component rack 102. The datacenter components 104 may be, for example, servers, JBODs, network switches, automatic transfer switches (ATSes), power distribution units (PDUs), or any other electronic equipment that is mountable in a datacenter component rack 102, such as a server rack.

The datacenter component 104 is illustrated in an open configuration, with a lid 110 tilted such that HDDs 106 within the datacenter component 104 are visible and accessible for service and maintenance. Within the datacenter component 104 the HDDs 106 are arranged in an array. Though illustrated as entirely filling the datacenter component 104, the HDDs 106 may only partially fill the datacenter component 104, and in some examples additional components may be included within the datacenter component 104. The HDDs 106 include status indicator lights 108 that provide an indication of the operating status of the HDDs 106 on a real-time basis. Additional components that may be included within the datacenter component 104 in addition to or in place of the HDDs 106 may include similar status lights and are therefore compatible with the techniques described herein. The status indicator lights 108 are selectively illuminable and may include light emitting diodes (LEDs) as well as other components, such as light pipes or other such devices for ensuring the status indicator lights 108 are visible to a service provider after opening the lid 110. Also included within the datacenter component 104 are a switch 112 and a temperature sensor 118. The switch 112 is actuated in response to opening and closing of lid 110. The temperature sensor 118 senses temperature data within the datacenter component 104. In some examples there may be additional temperature sensors, such as an array of temperature sensors 118 throughout the datacenter component 104.

The switch 112 may include any device capable of detecting when the lid 110 of the datacenter component 104 is open, including contact sensors, optical sensors, tilt sensors, spring-loaded switches, lever switches, or other such devices.

During service of the datacenter component 104, the lid 110 is opened after partially or entirely removing the datacenter component 104 from the datacenter component rack 102. The datacenter component 104 may still be operational, for example while performing a hot switch of HDDs 106 within the datacenter component 104. The datacenter component 104 is still operational, but active cooling from fans or other cooling means is compromised as the datacenter component 104 was partially removed or entirely removed and opened. At the time the lid 110 is opened, the switch 112 is actuated to convey a signal to the computing resource 114, which may be a computing resource remote to the datacenter component 104, and in some cases remote to the datacenter component rack 102 as well, or a local computing resource, and in some example may even be built into the datacenter component 104. The computing resource 114, upon receiving the signal from the switch 112, may initiate a countdown timer counting down from a predetermined period of time, beyond which the datacenter component 104 is at risk of overheating and becoming damaged. The predetermined period of time is based upon a safe period of time to operate the datacenter component 104 with compromised active cooling and may, in some examples, be in a range of four to five minutes. Depending upon the datacenter component 104 and the operating conditions, the predetermined period of time may be less than four minutes or greater than five minutes.

In some examples, the predetermined period of time may be adjustable based on temperature data from the temperature sensor 118, for example by shortening the predetermined period of time when the temperature data indicates a temperature within the datacenter component 104 has risen above a threshold, is rising at a rate greater than a threshold rate, or is otherwise near an overheating temperature for the components of the datacenter component 104. In some examples, temperature sensor 118 provides temperature data to the computing resource 114. The temperature data may be used by computing resource 114 to determine a maintenance window. In some examples this may include selecting a predetermined time period based on a lookup table of previous maintenance and temperature history stored in a memory of the computing resource 114.

The computing resource 114 communicates with the HDDs 106 or at least with the datacenter component 104 to cause the status indicator lights 108 to display a visual representation of the predetermined period of time, or the time elapsed since switch 112 was actuated. Examples of some visual representations are included with respect to FIGS. 4-6 and include displaying, using the status lights, 7-segment digits representing a period of time remaining in the maintenance window, displaying an image or graphical representation, or displaying a percentage of status lights in an "ON" setting based on the percentage of the maintenance window remaining.

The computing resource 114 can include a distributing computing network, a single computing device, a cloud computing device, or any other suitable computing device including a processor and a non-transitory memory capable of storing and performing instructions to carry out the techniques described herein. An example of the computing resource 114 is described with respect to FIG. 8. The computing resource 114 overrides the normal operation of the status indicator lights 108 to cease showing the normal status indications and instead show a visualization of the maintenance time, either elapsed or remaining, as described herein. In some examples, the status lights may operate in a normal operating mode and in a service time mode. The status lights may be controlled by a host of a server, such as a baseboard management controller ("BMC") of a server. The BMC may include a processor and memory and be capable of providing instructions to the status lights to cause the status lights to operate in the normal operating mode or the service time mode. In some examples, the operation of the status lights may be controlled by a remote computing device interfacing with the server.

The network(s) 116 can include any appropriate network, including an intranet, the Internet, a cellular network, a local area network, a wired connection, a wireless connection, or any other such network or combination thereof. The network(s) 116 provides communications between the datacenter component 104 and the computing resource 114. As such, the datacenter component 104, computing resource 114, and/or the datacenter component rack 102 may include additional components enabling communication between different components of system 100.

Figure 2:
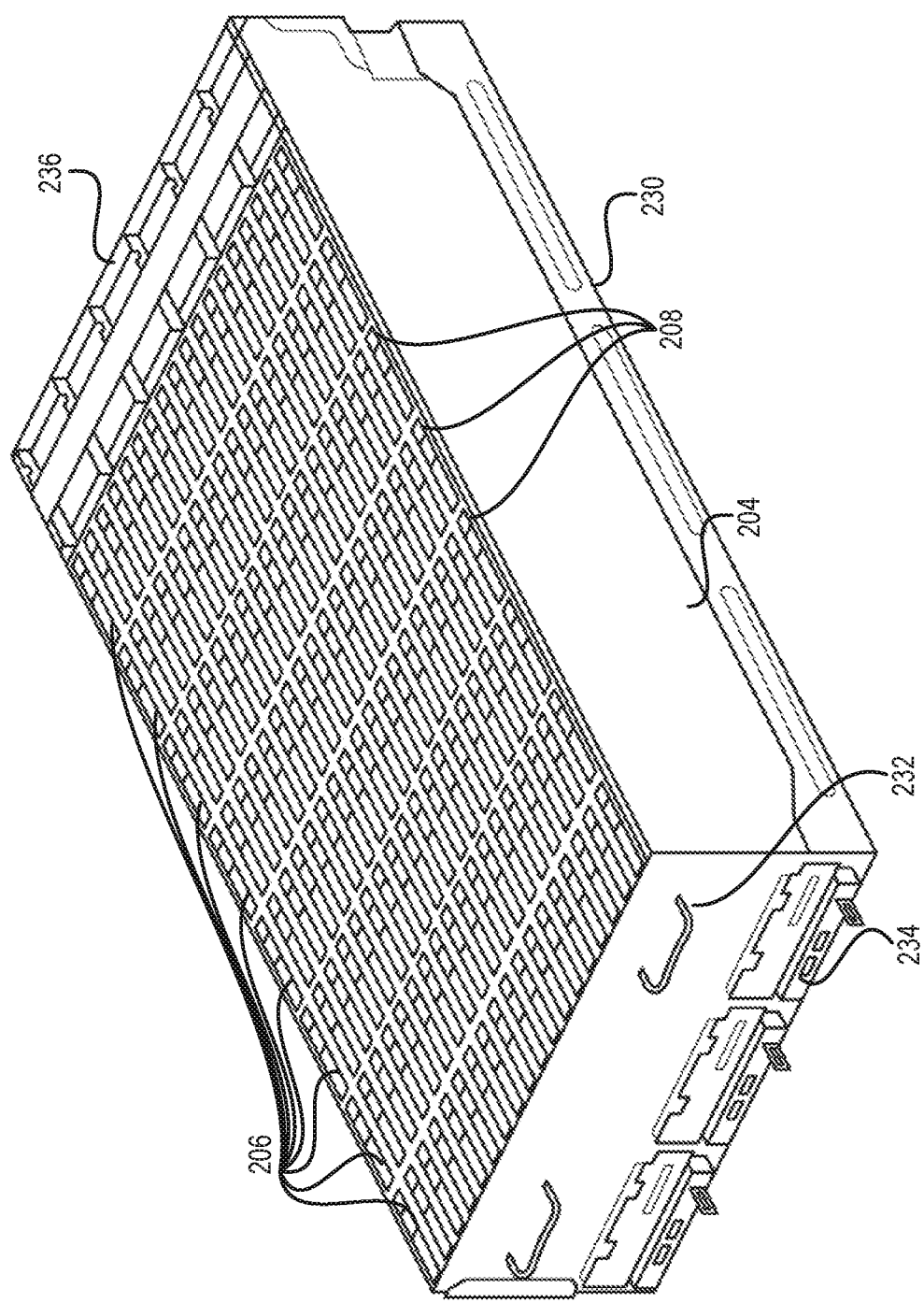
FIG. 2 illustrates a perspective view of an example datacenter component with maintenance time tracking, according to at least some embodiments.

FIG. 2 illustrates a perspective view of a datacenter component 204 with maintenance time tracking, according to at least some embodiments. The datacenter component 204 may be the same as the datacenter component 104 of FIG. 1. The datacenter component 204 is shown with a lid removed such that HDDs 206 of the datacenter component 204 are visible, as they would be visible during maintenance on the datacenter component 204. The datacenter component 204 includes HDDs 206 arranged in rows and columns. Any arrangement of HDDs 206 or other components within the datacenter component 204 is envisioned, though a series of identical rows are displayed, in some examples the HDDs 206 may include HDDs 206 of varying sizes.

The datacenter component 204 includes handles 232, rails 230, status indicators 234, and connections 236. The handles 232 and rails 230 enable a service provider to slide and remove, or partially remove, the datacenter component 204 from a datacenter component rack 102. The rails 230 may include linear slides, such as drawer slides to ease sliding of the datacenter component 204 and support the datacenter component 204 during maintenance when partially removed from the datacenter component rack 102. Connections 236 may include data connections, coolant fluid connections, and other such connections for operation and communication of the datacenter component 204 with other systems, such as the datacenter component rack 102.

Each HDD 206 includes a status indicator light 208. The status indicator light 208 may also include light pipes or other components to cause a status indicator light 208 to be visible on top of each of the HDDs 206. An example of the HDDs 206 is illustrated and described with respect to FIG. 3.

Figure 3:
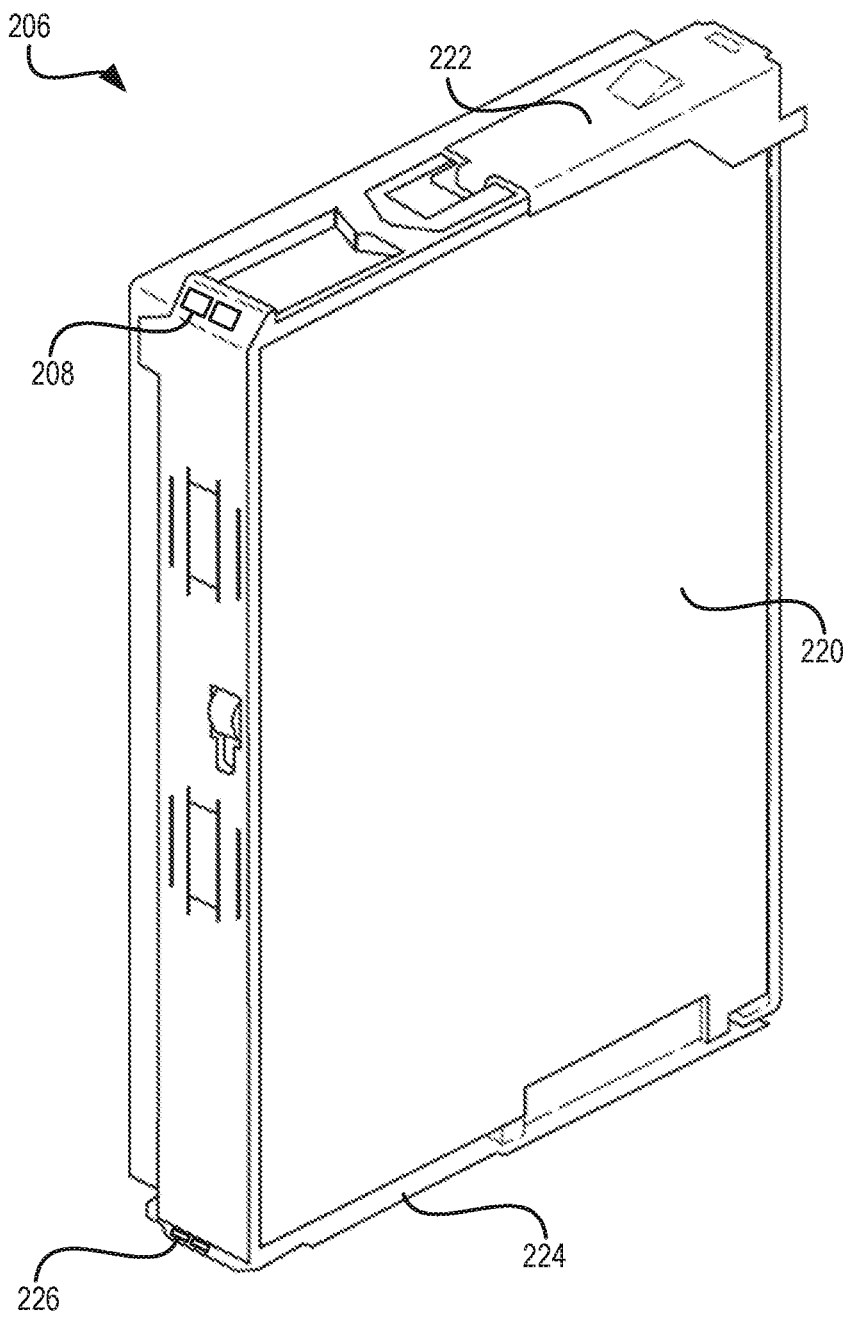
FIG. 3 illustrates a perspective view of an example component of the datacenter component of FIG. 2, according to at least some embodiments.

FIG. 3 illustrates a perspective view of a HDD 206 of the datacenter component 204 of FIG. 2, according to at least some embodiments. The datacenter component 204 may, in some examples, include other components, such as a motherboard, processor, memory, hard disk drives, network communication devices, power supply, graphics device, or any other suitable device that may be included in a datacenter component 204 and include a status indicator light 208. The HDD 206 includes a status indicator light 208, LEDs 226, latch 222, drive 220, and interface 224. The HDD 206 couples to the datacenter component 204 at the interface 224 where data and power connections are provided between the drive 220 and the datacenter component 204. The interface 224 may include the LEDs 226. The HDD 206 also includes a latch 222, which may be actuated to remove drive 220 from HDD 206. Drive 220 may be replaceable, for example during a hot switch of drives 220 while datacenter component 204 is in operation.

The status indicator light 208 is visible on an upper surface of the HDD 206 when the HDD is installed in the datacenter component 204. To allow visibility, the status indicator light 208 may include a light pipe that runs the height or length of the HDD 206 and originates at the LEDs 226. In this configuration, the LEDs 226 may provide the status indicator lights and the light pipe provides a conduit for the light from the LEDs 226 to be visible at the status indicator light 208. The LEDs 226 may be color-configurable, selectively illuminated, and illuminated with varying brightness or intensity as controlled by signals from computing resource 114. The status indicator light 208 of each of the HDDs 206 may be independently controllable by the computing resource 114 to provide visual indicators of maintenance time, such as elapsed maintenance time or remaining maintenance time until a maintenance window expires. Examples of visual representations that may be presented using the status indicator lights 208 are presented with respect to FIGS. 4-6.

Figure 4:
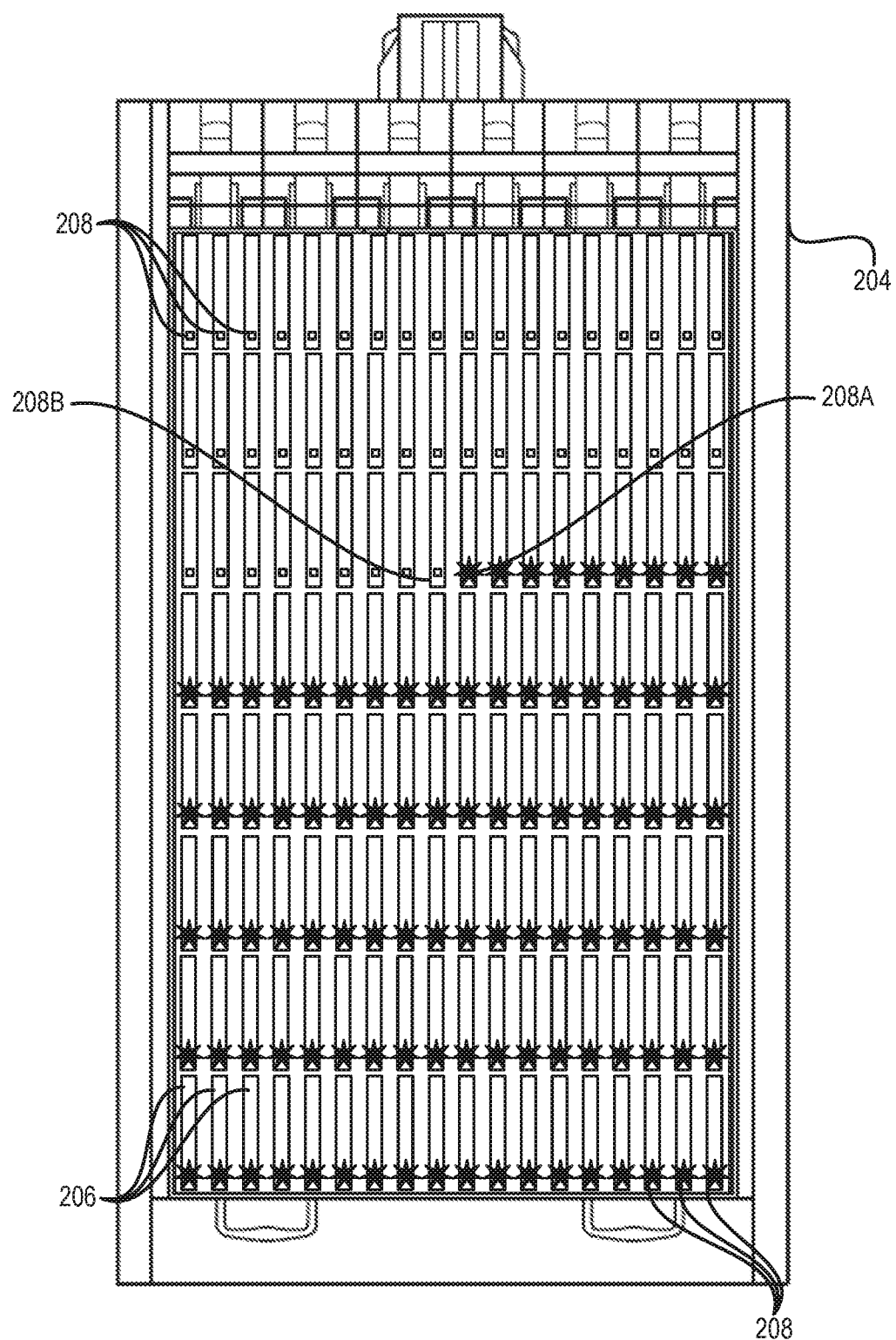
FIG. 4 illustrates a top view of the datacenter component of FIG. 2, according to at least some embodiments.

FIG. 4 illustrates a top view of the datacenter component 204 of FIG. 2, according to at least some embodiments. The top view shows the datacenter component 204, the HDDs 206, and the status indicator lights 208. The status indicator lights 208 are shown in ON and OFF configurations, with the ON status indicator lights 208A and the OFF status indicator lights 208B. In the example shown in FIG. 4, the status indicator lights 208 are controlled between the ON and OFF configurations based on a signal from the computing resource 114. The ON and OFF configurations are useful for providing a clear visual representation of a remaining time period in a maintenance window. In particular, for any given maintenance window, such as a predetermined time period of around four minutes, each status indicator light 208 is initially illuminated before any time has elapsed, e.g., when the lid 110 has just been removed. As time elapses, individual status indicator lights 208 switch from ON to OFF to indicate the passage of time. In some examples, the status indicator lights 208 may switch from the OFF configuration to the ON configuration as time passes rather than switching OFF.

In an exemplary illustration, subsequent status indicator lights 208 may be switched off after a period of around five seconds. In this illustration, a service provider may observe the illuminated status indicator lights 208A and quickly and easily have an understanding of remaining maintenance time before the maintenance window expires. When the status indicator lights 208 are all switched OFF, similar to the depicted status indicator light 208B, then the maintenance window has fully expired and the datacenter component 104 should be returned to the datacenter component rack 102 and closed for continued operation without danger of overheating.

In some examples the temperature sensor 118 may gather temperature data within the datacenter component 204 and the maintenance window or time period for maintenance may be adjusted, for example by shortening the time period when the temperature rises significantly or extending the time period if the temperature remains constant. In such examples, the status indicator lights 208 may be selectively illuminated to reflect the updated time period.

In some examples, upon shutting the lid 110 of the datacenter component 104, the switch 112 may actuate and convey a signal to the computing resource 114. The computing resource 114 may then log, in a memory, data relating to the maintenance performed including the time elapsed during the maintenance, the type of maintenance performed (as available from a relevant work order or other such database), the temperature data from the temperature sensor 118 at a time before, during, and after the maintenance.

In some examples, the status indicator lights 208 may begin to flash as the time period for maintenance nears expiration, so as to draw the attention of the service provider. The flashing status indicator lights may indicate that less than a minute of the time period remains, less than a threshold percentage of the time period remains, or indicate any other measure by which the time period is near expiration. In some examples, the visual representation shown by the status indicator lights 208 may be accompanied by audible notifications, such as an audible tone or beep. The beep may occur at a regular interval and may increase in frequency as the time period nears expiration. In some examples, the status indicator lights 208 and/or the audible notification may flash continuously upon expiration of the time period.

Figure 5:
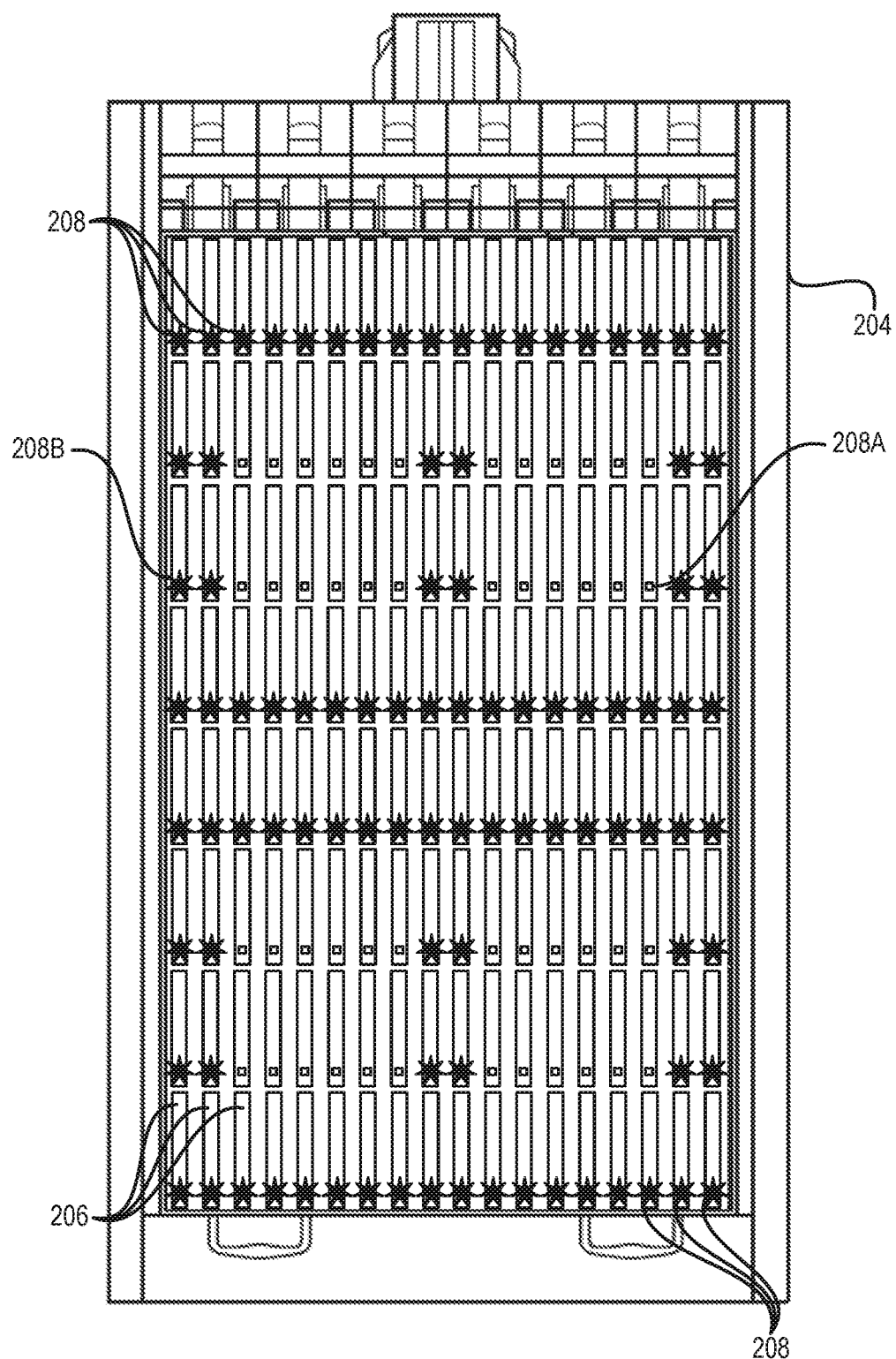
FIG. 5 illustrates a top view of the datacenter component of FIG. 2 with an illuminated representation of maintenance time, according to at least some embodiments.

FIG. 5 illustrates a top view of the datacenter component 204 of FIG. 2 with an illuminated representation of maintenance time, according to at least some embodiments. The components shown in FIG. 5 are identical to the components shown and described with respect to FIGS. 2-4. In FIG. 5, the computing resource 114 instructs the status indicator lights 208 to illuminate in a pattern forming 7-segment digits. The HDDs 206 are arranged in a grid across the length and width of the datacenter component 204 and therefore the status indicator lights 208 can be selectively illuminated, as shown by illuminated status indicator lights 208B and OFF status indicator lights 208A to form two 7-segment digits. In the example shown in FIG. 5, the two 7-segment digits are shown displaying the digit "88." In this manner, any numeral from zero to ninety-nine can be represented on the 7-segment display formed by the status indicator lights 208. In some examples, the array of status indicator lights 208 may support or enable more than two 7-segment digits, for example by including three or more 7-segment digits. The 7-segment digits of FIG. 5 are shown covering the entire surface of the datacenter component 204. In some examples, the 7-segment digit may only be displayed on a portion of the status indicator lights, for example in a corner or at one end of the datacenter component 204. For example, each digit may be represented through the use of ten status indicator lights arranged in a grid that is two wide by five high. In this manner, any single 7-segment numeral can be presented using the status indicator lights 208 and combinations can be used to show exact remaining maintenance time. For example a display of minutes and seconds may be presented using 7-segment numerals with a colon separating digits for minutes and seconds, in the format XX:XX. In some examples, the 7-segment digits may show a percentage, from zero to ninety-nine percent, of remaining time period as a percentage of original time for maintenance. Though some specific examples have been provided of numerals and representations of 7-segment digits and configurations thereof as displayed by the status indicator lights 208, other configurations and arrangements are anticipated and intended to be encompassed by the foregoing description including different size, shape, layout, and information displayed using the 7-segment numerals.

Figure 6:
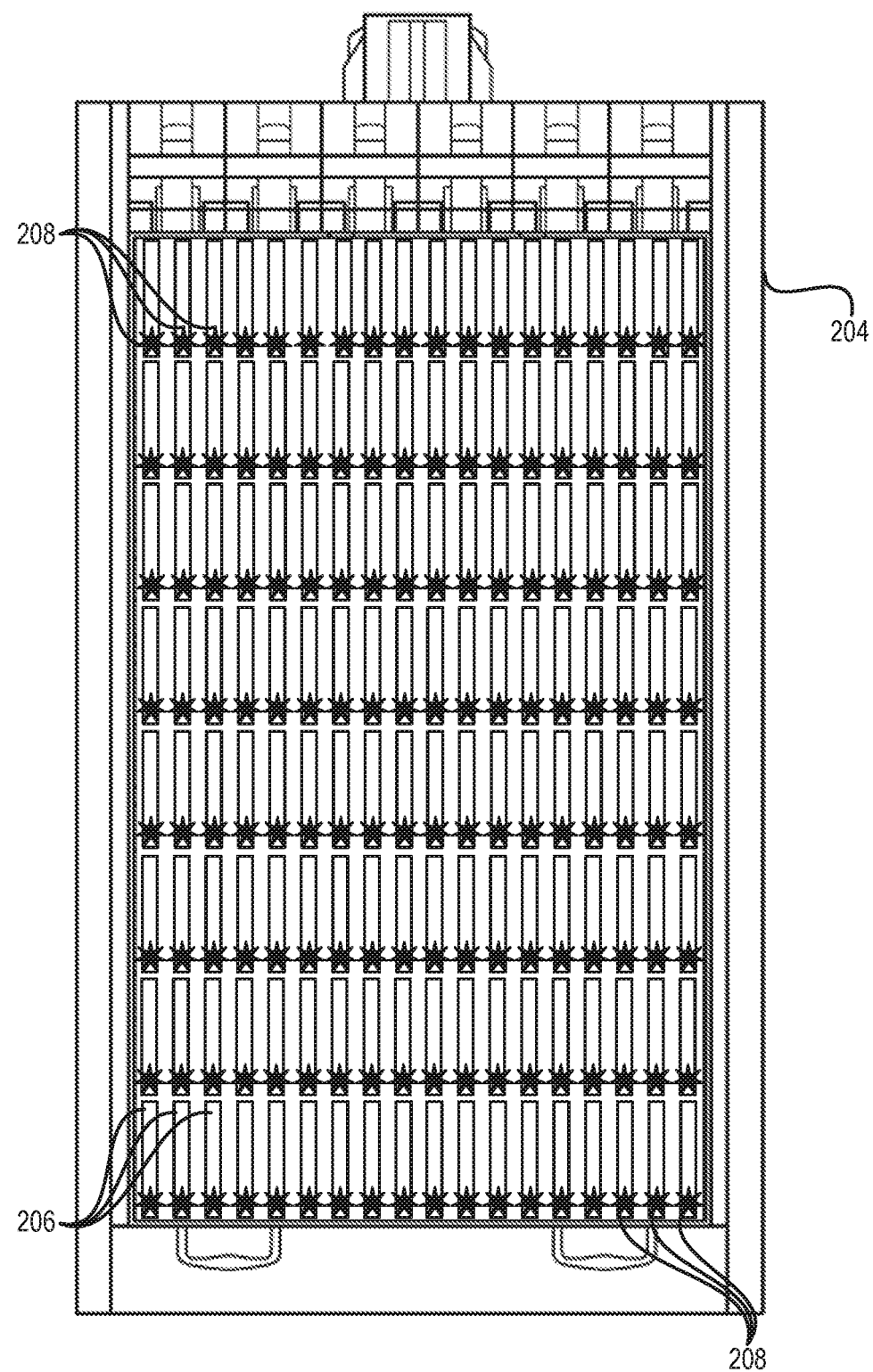
FIG. 6 illustrates a top view of the datacenter component of FIG. 2 with an illuminated representation of maintenance time, according to at least some embodiments.

FIG. 6 illustrates a top view of the datacenter component 204 of FIG. 2 with an illuminated representation of maintenance time, according to at least some embodiments. The components shown in FIG. 5 are identical to the components shown and described with respect to FIGS. 2-4. In the example shown in FIG. 6, the status indicator lights 208 may all be illuminated simultaneously and flash at varying intervals to represent different remaining periods of time for maintenance. In an example, the status indicator lights 208 may flash simultaneously at an interval of once every five seconds until half of the time period for maintenance has elapsed. The interval between flashes may then decrease to two seconds between flashes. At less than twenty-five percent of the time period, the status indicator lights 208 may flash at time intervals of one second or less. In some examples, the time intervals between the flashes and the thresholds at which the time intervals change may be different from the example described above, but are intended to be encompassed by the description herein.

Additional visualizations and representations of elapsed or remaining time for service of a datacenter component 204 are envisioned according to the disclosure, and may be displayed by the status indicator lights 208 according to the description herein. Specific examples of configurations of displays and switching ON-OFF of status indicator lights 208 may differ from those described herein but are within the spirit of the disclosure. In some examples, the additional visualizations may include graphical representations, such as a representation of an hourglass or other image to indicate or otherwise convey information relating to the remaining service time period.

Figure 7:
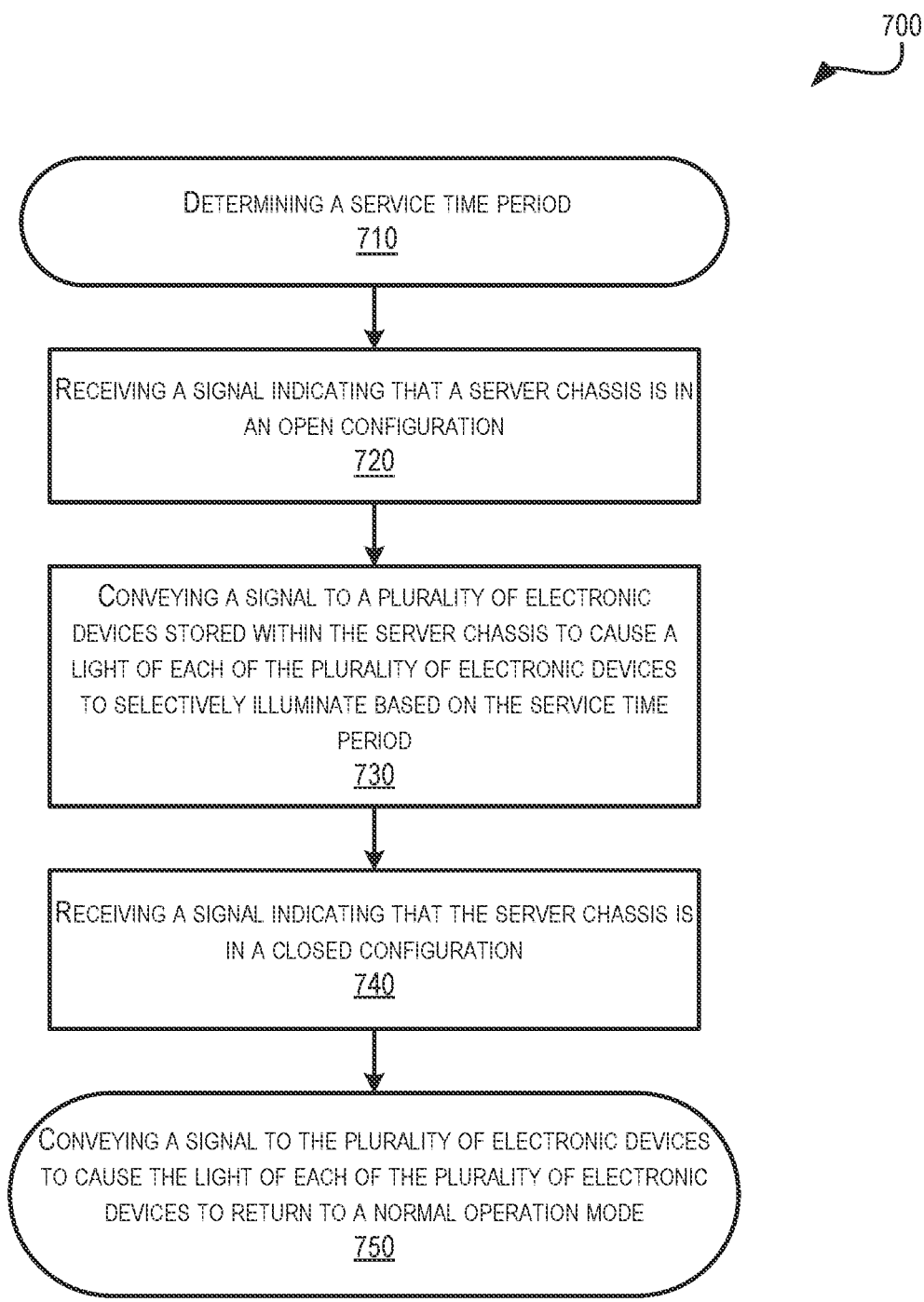
FIG. 7 illustrates an example process for tracking maintenance time of a datacenter component, according to at least some embodiments.

FIG. 7 illustrates an example process for tracking maintenance time of a datacenter component, such as datacenter component 204, according to at least some embodiments. Some or all of the process 700 (or any other processes described herein, or variations, and/or combinations thereof) may be performed under the control of one or more computer systems, such as computing resource 114, configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

At 710, the process 700 includes determining a service time period. Determining the service time period may include selecting or accessing a service time period from a storage memory of a computing device. In some examples, determining the service time period may include determining a variable service time period. A variable service time period may be based on current operating conditions of a server, such as the datacenter component 104. For example, the current operating conditions may include the traffic, usage, or current temperature of the server. In some examples, a predetermined service time period may be adjusted based on the current operating conditions, for example by shortening the time period when the temperature is increasing at an above average rate, or a temperature within the server chassis is above a normal operating temperature.

At 720, the process 700 includes receiving a signal indicating that a server chassis is in an open configuration. In some examples, at 720, the process 700 includes receiving a signal from a sensor indicating that the server chassis is in a service configuration, e.g., in a configuration for service to be performed thereon. The server chassis may be the datacenter component 104 or 204 as described herein. In some examples, the server chassis is removed from a datacenter component rack 102 prior to being in an open configuration. The open configuration may expose one or more components within the server chassis, for example by removing a lid of the server chassis. The signal indicating that the server chassis is in the open configuration may originate at a switch or sensor connected to the server chassis that detects opening or removal of a cover of the server chassis.

In some examples, the service time period may be adjusted and re-calculated or determined during the service time period. For instance, the temperature within the server chassis may begin to quickly rise during maintenance and therefore the service time period may be truncated or shortened such that the remaining service time period is shorter that initially determined.

At 730, the process 700 includes conveying a signal to a plurality of electronic devices stored within the server chassis to cause a light of each of the plurality of electronic devices to selectively illuminate based on the service time period. The signal may instruct a plurality of LEDs arranged within the server chassis, for example on HDDs 206, to illuminate and provide a visual representation of the service time period. The visual representation may include the examples shown and described with respect to FIGS. 3-6 and include selectively de-activating LEDs as time elapses, displaying 7-segment digits, flashing LEDs at varying time intervals, or other such visual representations.

At 740, the process 700 includes receiving a signal indicating that the server chassis is in a closed configuration. The signal may be received from the switch within or connected to the server chassis. In some examples, the signal may be generated in response to returning the server chassis into a datacenter component rack 102. The signal is received at the computing device, such as computing resource 114 and may trigger additional actions by the computing resource. For example, the step performed at 740 may be triggered in response to receiving the signal indicating the server chassis is in the closed configuration. In some examples, upon receiving the signal indicating the server chassis is in the closed configuration, the computing device may record data relating to the maintenance session including the total time elapsed during maintenance, the maintenance performed or components replaced, the temperature data from the temperature sensor, or other such data relating to operations performed or data gathered or associated with the maintenance.

At 750, the process 700 includes conveying a signal to the plurality of electronic devices to cause the light of each of the plurality of electronic devices to return to a normal operation mode. In the normal operation mode, the lights may return to indicating the status of the components within the server chassis, for example to display status indication information.

Figure 8:
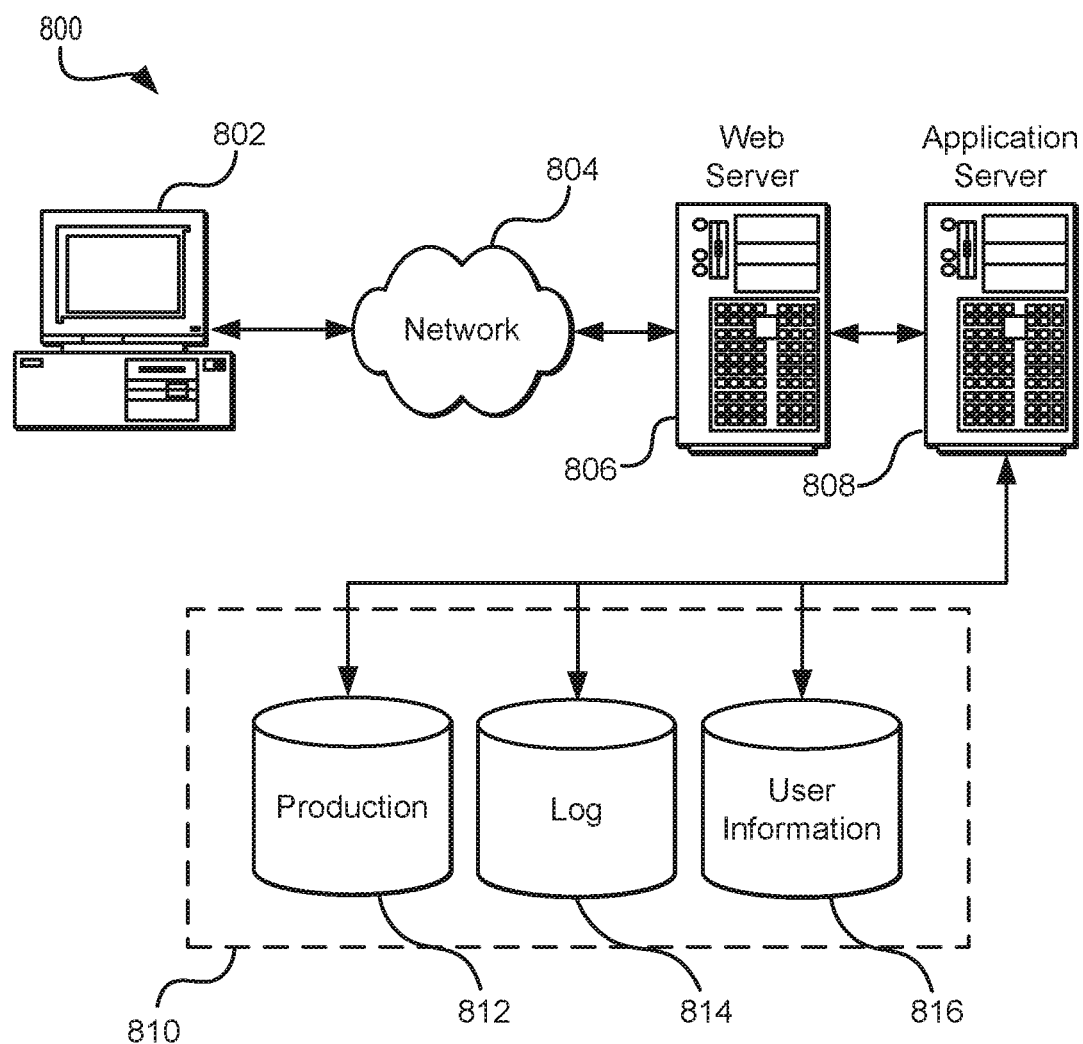
FIG. 8 illustrates an environment in which various embodiments can be implemented.

FIG. 8 illustrates aspects of an example environment 800 for implementing aspects in accordance with various embodiments. As will be appreciated, although a Web-based environment is used for purposes of explanation, different environments may be used, as appropriate, to implement various embodiments including network-based environments for accessing service time periods, operating countdown timers counting down from the service time period to zero, and instructing or causing lights to selectively illuminate based on the service time period and/or elapsed time during maintenance. The environment includes an electronic client device 802, which can include any appropriate device operable to send and receive requests, messages, or information over an appropriate network 804 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Devices used for such a system can depend at least in part upon the type of network and/or environment selected. Protocols and devices for communicating via such a network are well known and will not be discussed herein in detail. Communication over the network can be enabled by wired or wireless connections and combinations thereof. In this example, the network includes the Internet, as the environment includes a Web server 806 for receiving requests and serving content in response thereto, although for other networks an alternative device serving a similar purpose could be used as would be apparent to one of ordinary skill in the art.

The illustrative environment includes an application server 808 and a data store 810. It should be understood that there can be several application servers, layers, or other components, processes, or devices, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. The handling of all requests and responses, as well as the delivery of content between the electronic client device 802 and the application server 808, can be handled by the Web server. It should be understood that the Web and application servers are not required and are merely example components, as structured code discussed herein can be executed on any appropriate device or host machine as discussed elsewhere herein.

The data store 810 can include several separate data tables, databases or other data storage mechanisms and media for storing data relating to a particular aspect. For example, the data store illustrated includes mechanisms for storing production data 812 and user information 816, which can be used to serve content for the production side. The data store also is shown to include a mechanism for storing log data 814, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the electronic client device 802. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of the example environment 800 in FIG. 8 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware components that may be electrically coupled via a bus, the components including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other components located within at least one working memory device, including an operating system and application programs, such as a client application or Web browser. It should be appreciated that alternate embodiments may have numerous variations from that described above. For example, customized hardware might also be used and/or particular components might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed component as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described components in all possible variations thereof is encompassed by the disclosure unless otherwise indicated herein or otherwise clearly contradicted by context.

What is claimed is:

1. A server comprising:
   a chassis;
   a lid mounted to the chassis and reconfigurable to an open position;
   a sensor that indicates when the lid is in the open position;
   a plurality of storage devices mounted in the chassis in an array and accessible through the lid, each storage device of the plurality of storage devices comprising a light emitting diode (LED);
   one or more processors; and
   one or more non-transitory computer readable media having instructions stored thereon that when executed, cause the one or more processors to:
      receive a signal from the sensor indicating the lid is in the open position;
      responsive to the signal, start a countdown timer counting down from a predetermined period of time; and
      cause at least some of the LEDs of the plurality of storage devices to display a visual representation of the countdown timer.

2. The server of claim 1, wherein the display of the visual representation of the countdown timer comprises a display of a number representative of the countdown timer.

3. The server of claim 1, wherein the display of the visual representation of the countdown timer comprises an illumination of a fraction of the LEDs based on a fraction of the predetermined period of time remaining on the countdown timer.

4. The server of claim 1, wherein the display of the visual representation of the countdown timer comprises flashing of at least one of the LEDs at a varying rate based on an amount of time remaining on the countdown timer.

5. A system comprising:
   a server chassis;
   a sensor that detects when the server chassis is in a service configuration;
   a plurality of lights within the server chassis;
   one or more processors; and
   one or more non-transitory computer readable media having instructions stored thereon that, when executed, cause the one or more processors to:
      receive a signal from the sensor indicating a reconfiguration of the server chassis to the service configuration; and
      cause the lights to selectively illuminate based on an elapsed time since the reconfiguration of the server chassis to the service configuration.

6. The system of claim 5, wherein the lights are selectively illuminated to display a graphical representation of a service time period.

7. The system of claim 6, further comprising a temperature sensor positioned within the server chassis to detect a temperature within the server chassis, and wherein the one or more non-transitory computer readable media store additional instructions that, when executed, cause the one or more processors to receive temperature data from the temperature sensor, and wherein the service time period is based on the temperature data.

8. The system of claim 6, wherein the service time period is predetermined.

9. The system of claim 5, wherein the one or more non-transitory computer readable media store additional instruction that, when executed, cause the one or more processors to determine a service time period, and wherein the lights are selectively illuminated based further on the service time period.

10. The system of claim 9, wherein the lights are selectively illuminated so that a percentage of the lights that are illuminated or not illuminated is indicative of the elapsed time since the reconfiguration of the server chassis to the service configuration.

11. The system of claim 5, wherein the lights are selectively illuminated to display a 7-segment digit indicative of the elapsed time.

12. The system of claim 5, wherein the one or more non-transitory computer readable media store additional instructions that, when executed, cause the one or more processors to access a predetermined time period for service of electronic components mounted to the server chassis; and wherein the lights are selectively illuminated based on a difference between the predetermined time period and the elapsed time.

13. A method, comprising:
receiving a signal from a sensor indicating a reconfiguration of a server chassis to a service configuration;
determining a service time period for the server chassis; and
conveying a second signal to at least one of a plurality of electronic components stored within the server chassis to cause at least one light of the at least one of the plurality of electronic components to selectively illuminate based on an elapsed time since the reconfiguration of the server chassis to the service configuration and on the service time period for the server chassis.

14. The method of claim 13, further comprising:
receiving temperature data corresponding to a temperature within the server chassis; and
determining a remaining service time period based on the temperature data, and wherein determining the service time period is based further on the remaining service time period.

15. The method of claim 13, further comprising:
determining a remaining service time period based on a difference between the elapsed time and the service time period, and wherein conveying the second signal to the at least one of the plurality of electronic components causes the at least one light to selectively illuminate further based on the remaining service time period.

16. The method of claim 13, wherein determining the service time period for the server chassis comprises:
accessing a predetermined service time period; and
determining a remaining service time period based on a difference between the predetermined service time period and the elapsed time after receiving the signal indicating the reconfiguration of the server chassis to the service configuration.

17. The method of claim 16, wherein conveying the second signal to the at least one of the plurality of electronic components causes the at least one light to selectively illuminate so as to display a 7-segment digit representative of the remaining service time period.

18. The method of claim 16, further comprising determining a percentage of service time remaining based on the predetermined service time period and the remaining service time period, and wherein conveying the second signal to the at least one of the plurality of electronic components causes a percentage of the lights of the at least one of the plurality of electronic components to selectively illuminate based on the percentage of service time remaining.

19. The method of claim 16, wherein conveying the second signal to the at least one of the plurality of electronic components causes at least one of the lights of the at least one of the plurality of electronic components to selectively illuminate based on the remaining service time period.

20. The method of claim 16, wherein conveying the second signal to the at least one of the plurality of electronic components causes the lights to flash at a predetermined rate based on the remaining service time period.

* * * * *